US010317433B2

(12) United States Patent
Ergin et al.

(10) Patent No.: US 10,317,433 B2
(45) Date of Patent: Jun. 11, 2019

(54) OPTOELECTRIC MEASURING DEVICE AND METHOD FOR MEASURING AN ELECTRICAL CURRENT

(71) Applicant: SIEMENS AKTIENGESELLSCHAFT, Munich (DE)

(72) Inventors: Dominik Ergin, Baiersdorf (DE); Michael Hofstetter, Munich (DE); Michael Willsch, Jena (DE)

(73) Assignee: Siemens Aktiengesellschaft, Munich (DE)

( * ) Notice: Subject to any disclaimer, the term of this patent is extended or adjusted under 35 U.S.C. 154(b) by 64 days.

(21) Appl. No.: 15/544,135

(22) PCT Filed: Jan. 16, 2015

(86) PCT No.: PCT/EP2015/050774
§ 371 (c)(1),
(2) Date: Jul. 17, 2017

(87) PCT Pub. No.: WO2016/112993
PCT Pub. Date: Jul. 21, 2016

(65) Prior Publication Data
US 2017/0350922 A1 Dec. 7, 2017

(51) Int. Cl.
*G01R 15/24* (2006.01)
*G01R 1/20* (2006.01)
(52) U.S. Cl.
CPC ............ *G01R 15/246* (2013.01); *G01R 1/20* (2013.01); *G01R 15/247* (2013.01)

(58) Field of Classification Search
CPC .................................................. G01R 15/247
See application file for complete search history.

(56) References Cited

U.S. PATENT DOCUMENTS

| 3,513,322 A | 5/1970 | Bernard |
| 3,597,683 A | 8/1971 | Saito et al. |
| 4,070,622 A | 1/1978 | Harms et al. |
| 4,370,612 A | 1/1983 | Puech et al. |
| 5,051,577 A | 9/1991 | Lutz et al. |

(Continued)

FOREIGN PATENT DOCUMENTS

| CN | 102495260 A | 6/2012 |
| DE | 19608944 A1 | 9/1997 |

(Continued)

*Primary Examiner* — Clayton E. LaBalle
*Assistant Examiner* — Jas A Sanghera
(74) *Attorney, Agent, or Firm* — Laurence Greenberg; Werner Stemer; Ralph Locher

(57) ABSTRACT

A measuring device measures an electrical current and contains a light source for generating a polarized primary light signal for feeding into a Faraday sensor unit, and a detector for detecting a secondary light signal provided by the Faraday sensor unit and polarization-altered in relation to the primary light signal. An optical-electrical compensation element, by which the polarization alteration of the secondary light signal can be compensated via an opposite polarization alteration, and a measurement signal, according to the opposite polarization alteration, for the electrical current can be deduced. A method for measuring an electrical current by use of the measuring device is further disclosed.

15 Claims, 3 Drawing Sheets

(56) References Cited

U.S. PATENT DOCUMENTS

| | | | |
|---|---|---|---|
| 5,434,501 A | 7/1995 | Esman et al. | |
| 5,811,964 A | 9/1998 | Bosselmann et al. | |
| 6,154,022 A | 11/2000 | Willsch et al. | |
| 6,707,558 B2 | 3/2004 | Bennett | |
| 8,542,366 B2 | 9/2013 | Haywood | |
| 2011/0141478 A1* | 6/2011 | Sasaki | G01R 15/246 356/483 |
| 2012/0286767 A1 | 11/2012 | Chamorovskiy et al. | |

FOREIGN PATENT DOCUMENTS

| | | |
|---|---|---|
| DE | 19952952 A1 | 6/2000 |
| EP | 0865610 B1 | 3/2000 |
| JP | S43016402 B | 7/1968 |
| JP | S462233 B | 1/1971 |
| JP | S51147218 U | 11/1976 |
| JP | S5655864 A | 5/1981 |
| JP | S58172557 A | 10/1983 |
| JP | H06300786 A | 10/1994 |
| JP | H10132862 A | 5/1998 |
| JP | H10227814 A | 8/1998 |
| JP | 2008256368 A | 10/2008 |
| WO | 2009103126 A1 | 8/2009 |

\* cited by examiner

OPTOELECTRIC MEASURING DEVICE AND METHOD FOR MEASURING AN ELECTRICAL CURRENT

BACKGROUND OF THE INVENTION

Field of the Invention

The invention relates to a measuring device for measuring an electrical current, with a light source for generating a polarized primary light signal for feeding into a Faraday sensor device, and with a detector for detecting a secondary light signal provided by the Faraday sensor device and altered in polarization in relation to the primary light signal.

Such a measuring device is known, for example, from EP 0 865 610 B1. The measurement of the electrical current is based here on the so-called Faraday effect. The Faraday effect refers to the change in the refractive index of certain materials depending on a magnetic field. This effect can be used to change a polarization state of light that is passing through the material. Particularly in the case of linearly polarized light, the change causes a rotation in a plane of polarization of the light. Ideally, the corresponding angle of the rotation is proportional to a line integral of the magnetic field along the path traveled by the light in the material. From the detection of the change of the polarization state in a detector, and its subsequent evaluation, a measured parameter can thus be obtained that contains information about a current generating the magnetic field.

Disadvantageous to the known measuring device is the fact that the precision of the measurement of the polarization state of, for example, a polarization angle, which is usually done by means of interferometers or polarization analyzers, is relatively complex and only of limited precision. This effect is thus only unambiguous up to a polarization rotation of 90°, and both the non-linearity and the temperature dependency of this Faraday effect for example limit the precision. An increase of the precision is always associated with a rise in the cost of the detector and an increased liability to errors in the measuring device.

SUMMARY OF THE INVENTION

The object of the invention is to propose a measuring device of the above-described type that permits the most accurate and reliable measurement possible.

The object is achieved by a generic measuring device in that a compensation element is provided, by means of which the change in the polarization of the secondary light signal can be compensated for by an opposite change in the polarization, and a measurement signal that depends on the opposite change in the polarization can be derived for the electrical current.

The invention is based on the recognition that a zero-measurement is more precise and can be carried out with reduced dependency on environmental influences and with reduced complexity of the detection scheme than the direct measurement of the polarization state. Due to the compensation of the change in the polarization of the secondary light signal, the detector in this case only has to be suitable for a zero-measurement of the change in the polarization. Fundamentally, in other words, a measurement that only establishes whether a change in the polarization is present or not is necessary in the detector. The compensation of the change in the polarization is here achieved through the opposite change in the polarization, i.e. through a new change in the polarization that acts against the change in the polarization achieved in the Faraday sensor device. For example, a rotation of the plane of polarization of a linearly polarized primary light signal through a specific angle of rotation can be compensated for by a new rotation of the plane of polarization of the secondary light signal through an angle of rotation with the same magnitude but in the opposite direction.

The measurement signal for the electrical current to be measured is derived here depending on the opposite change in the polarization. This means that to derive the measurement signal using the measuring device according to the invention, direct use is not made of the change in the polarization, but a measure for the opposite polarization is employed.

In this way the measuring device according to the invention combines the advantages of the known measuring devices based on the Faraday effect with the advantages of a zero-measurement.

A further advantage of the measuring device according to the invention arises in that, through the possibility of using optical fibers between the Faraday sensor device and the detector, a voltage isolation can be realized economically in the case of an application in high-voltage engineering, since this is in any case inherent in the system. The compensation element can be driven electrically through the possibility of positioning at ground potential. The detector can at the same time operate at this ideal working point. High precision of measurement can be achieved in this way. A measurement is also possible that is independent of unwanted side-effects such as temperature effects. An improved reliability of the measurement is thus an advantage of the present invention.

The present invention is suitable both for the measurement of direct currents and for the measurement of alternating currents.

The Faraday sensor device for carrying of the primary light signal can, for example, comprise a light fiber coil or a glass ring. It is appropriate for the light fiber coil or the glass ring to be wound around an electrical conductor or an electrical cable that carries the electrical current to be measured. The change in the polarization can be reinforced through a multiple passage of the light through the magnetic field generated by the flowing current. The glass of the glass ring can, for example, be bulk glass.

The compensation element can, for example, be an optoelectrical compensation element comprising optical elements and elements carrying electrical current.

According to a preferred form of embodiment of the invention, the compensation element comprises a compensating Faraday sensor device and a compensation electrical conductor arranged close to the compensating Faraday sensor device, wherein the secondary light signal passes through the compensating Faraday sensor device, and a compensation current in the compensation electrical conductor can be adjusted in such a way that the change in the polarization of the secondary light signal can be compensated, wherein the measurement signal can be derived from the compensation current. The compensation electrical conductor accordingly carries a current that generates a compensating magnetic field. The compensating magnetic field acts on the secondary light signal, because the compensating Faraday sensor device that carries the secondary light signal is located close to it. The compensating magnetic field appropriately causes the opposite change of polarization through which the change of polarization of the secondary light signal is compensated. The compensation current through the compensation electrical conductor can be adjusted in such a way that the compensation of the change of polarization is achieved. The value of the compensation current thus carries quantitative information about the electrical current to be measured. The measurement signal can therefore be derived from the compensation current. This form of embodiment of the invention exhibits the advantage that the measurement signal can be obtained from the compensation current relatively easily. The detector is here appropriately so designed as to establish whether the (complete) compensation of the change in the polarization at a given current through the compensation electrical conductor is present or not. This permits a particularly simple and robust structure of the detector. In addition, any non-linearities in the detector do not play a role.

Preferably the compensation element comprises a control device that is designed for a zero-regulation of the change of polarization of the secondary light signal or of a controlled variable derived from it, making use of the compensation current as the manipulated variable. The control device is accordingly designed to change the compensation current through the compensation electrical conductor until the change of polarization is compensated by an opposite polarization in the compensating Faraday sensor device. In this context, zero-regulation should thus mean that the controlled variable is to be regulated to a setpoint value equal to zero. The controlled variable is here given by the change of polarization or the magnitude derived from it. The feedback in the control loop is here appropriately achieved through the information obtained by means of the detector about the polarization state of the secondary light signal. The measurement signal for the electrical current to be measured can then be obtained from the value of the compensation current. The compensation current that is necessary for the complete compensation of the change of polarization namely carries information about the electrical current to be measured. A voltage measured across a suitable measurement resistor through which the compensation current flows can, for example, be used to determine the measurement signal. The zero-regulation permits a particularly accurate measurement of the electrical current. The regulation can, furthermore, be implemented in active or passive form (through the use of active or passive elements in the control loop), and can be highly dynamic. This advantageously leads to a dead time possibly as short as a few microseconds. The speed of the measurement is physically defined by the length of the light-carrying parts of the measuring device, as well as by the speed of the detector.

The Faraday sensor device and the compensating Faraday sensor device preferably have the same construction. If the compensating Faraday sensor device is a light-fiber coil, the windings of the light-fiber coil can be wound, for example, around the compensation electrical conductor. The number of windings of the Faraday sensor device and of the compensating Faraday sensor device is suitable for defining a transformation ratio between the electrical current to be measured and the compensation current necessary for compensation of the change of polarization. The costs of the measuring device can advantageously be lowered through the multiple use of identical parts. Furthermore, any temperature effects can in this way be reduced if the same temperature can be ensured in the environment of the two sensor devices, or if the temperature dependency of the relevant effects is known, so that any temperature differences that may be present can be calibrated or calculated out.

Preferably the detector is designed to detect a light intensity depending on a polarization state of the secondary light signal. The polarization state here is, for example, a polarization angle with reference to a preset zero angle of the detector. The detector can, for example, comprise a photodiode for detection of the light intensity. The detector is thus appropriately designed to evaluate the polarization state of the secondary light signal quantitatively. The measuring device or the detector can comprise suitable calculation components for quantitative evaluation.

According to an advantageous form of embodiment of the invention, the detector comprises a polarization analyzer. The polarization analyzer can, for example, be so designed that it supplies an intensity signal that depends on the polarization angle of the light signal when a linearly polarized light signal passes through the polarization analyzer. The intensity signal can then, for example, be received by the photodiode, and passed onto a suitable computing unit. This possibility for detecting the intensity depending on the polarization state is particularly simple, and therefore correspondingly economical and reliable.

Preferably the polarization analyzer is adjusted such that a secondary light signal without a change of polarization results in a zero-signal at an output of the detector. This can be done through a suitable selection of a zero angle. In this context, zero-signal is intended to mean that the intensity signal supplied by the polarization analyzer is zero, within the boundaries of the measuring precision, when the secondary light signal does not exhibit any change of polarization with respect to the primary light signal. This is, for example, also the case when the change of polarization of the secondary light signal is completely compensated by means of the compensation element.

It should be noted here that the detector can also be based on other measuring principles. The detector can, for example, comprise a Sagnak interferometer for detection of the intensity depending on the polarization state. Beyond this, any suitable interferometric evaluation can be used.

According to a particularly preferred form of embodiment of the invention, the Faraday sensor device is arranged close to a medium-voltage or high-voltage electrical conductor, so that the measurement signal for the electrical current in the high-voltage electrical conductor can be derived. In other words, the measuring device is in particular suitable for measuring current at a high voltage (for example at a potential of up to 800 kV). It is sufficient for the Faraday sensor device to be located in the magnetic field surrounding the high-voltage electrical conductor. It is, however, particularly advantageous if the Faraday sensor device, as just described, comprises an optical fiber or the like, and the optical fiber is wound around the high-voltage electrical conductor. The particular advantages of the measuring device in connection with medium-voltage and high-voltage installations emerge from the possibility of effective potential insulation between the high-voltage electrical conductor and the measuring device. The Faraday sensor device can, for example, be arranged close to parts of a medium-voltage or high-voltage installation that are at a medium voltage or high voltage. The detector, and other components of the measuring device, can be arranged at a potential close to ground. The primary and the secondary light signals can be guided over optical fibers between the Faraday sensor device and the detector. Due to the possible spatial separation between the Faraday sensor device and the detector and/or the compensation element, the construction and installation of the measuring device can be configured to be simple and secure. If an isolation element, such as for example a gas-insulated switchgear (GIS) or a high-voltage feedthrough is already provided in the high-voltage installation, the measuring device can be wound around it on the outside. The optical fibers of the measuring device can be passed through a hollow insulator. For applications in the field of high-voltage direct-current transmission, greater distances (of up to several kilometers) between the Faraday sensor device and the detector can in some circumstances also be possible and desirable.

A so-called spun high birefringence fiber (spun HiBi fiber), known to the expert, is particularly suitable for an application in connection with the invention. This is suitable both for use as the sensor fiber and for a transport of the polarization information.

According to a preferred form of embodiment of the invention, the light source and the detector are arranged close to ground potential, wherein the light source comprises a light generation element and, separate from it, a polarization element, wherein the light generation element and the polarization element are connected together by means of an optical fiber, and wherein the measuring device furthermore comprises a polarization-maintaining optical fiber to carry the primary light signal which connects the polarization element and the Faraday sensor device together. Parts of the measuring device can accordingly advantageously be spatially separated in such a way that the path length between the Faraday sensor device located close to the high-voltage electrical conductor that is arranged at high-voltage potential and the polarization element is as short as possible. This permits an advantageous lowering of the costs of the measuring device: for the relatively short distance between the polarization element and the Faraday sensor device, the relatively expensive polarization-maintaining optical fiber is used to carry the primary light signal; over the remainder of the relatively long path from the light generation element and the polarization element it is possible to use the relatively economical optical fiber, since the light does not have to have any well-defined polarization there. In this way, the light generation element can have a spatially variable arrangement, without significantly affecting the costs of the measuring device.

A further advantage can be achieved if the detector comprises a polarization analyzer and, separate from it, an intensity sensor, wherein the polarization analyzer and the intensity sensor are connected together by means of a further optical fiber, and wherein the measuring device furthermore comprises another polarization-maintaining optical fiber to carry the secondary light signal, which connects the Faraday sensor device and the polarization analyzer together. The information supplied by the polarization analyzer about the polarization state of the secondary light signal is contained in the intensity of the light provided by the polarization analyzer. This light therefore does not have to exhibit any defined polarization. The economical further optical fiber can therefore be used to carry the light provided by the polarization analyzer.

It is conceivable that the primary or secondary light signal is present in the form of modulated signals. In this case, phase modulation and/or intensity modulation can be used.

In general, two separate optical fibers can be provided to carry the primary light signal and the secondary light signal. It is, however, equally possible for the primary and secondary light signals to be carried in a common optical fiber. It can, furthermore, be advantageous if the at least one light fiber is fitted at its end with mirrors and/or at least one quarter-wave plate to influence the polarization further.

Preferably the detector is arranged physically close to the compensating Faraday sensor device. This permits a more compact construction of the measuring device. For example, the detector and the compensating Faraday sensor device can be arranged in an insulator foot of an insulator that extends between the high-voltage electrical conductor and the ground or to a part of a high-voltage installation whose potential is close to ground.

The invention further relates to a method for measuring an electrical current in which a primary light signal generated by means of a light source is fed into a Faraday sensor device which provides a secondary light signal with a polarization that has been changed in relation to the primary light signal.

Such a method exploits the known Faraday effect, and is described in the document EP 0 865 610 B1, already referred to above.

On the basis of the known method, the object of the invention is that of providing a method for the most accurate and reliable measurement possible of the electrical current.

The object is achieved according to the invention in that in the method previously referred to by means of a compensation element the change in the polarization of the secondary light signal is compensated for by an opposite change in the polarization, and a measurement signal that depends on the opposite change in the polarization is derived for the electrical current.

The advantages already described in connection with the measuring device according to the invention can be achieved by means of the method according to the invention.

According to a form of embodiment of the method, the compensation of the change of polarization of the secondary light signal is performed by means of a zero-regulation of the change of polarization or by means of a zero-regulation of a controlled variable derived from that. All the variants of the zero-regulation described before are applicable here.

Preferably the secondary light signal passes through a compensating Faraday sensor device that is arranged physically close to a compensation electrical conductor. The zero-regulation is performed here with a compensation current through the compensation electrical conductor as the manipulated variable.

The invention is further explained below with reference to FIGS. 1 to 3.

DESCRIPTION OF THE INVENTION

Figure 1:
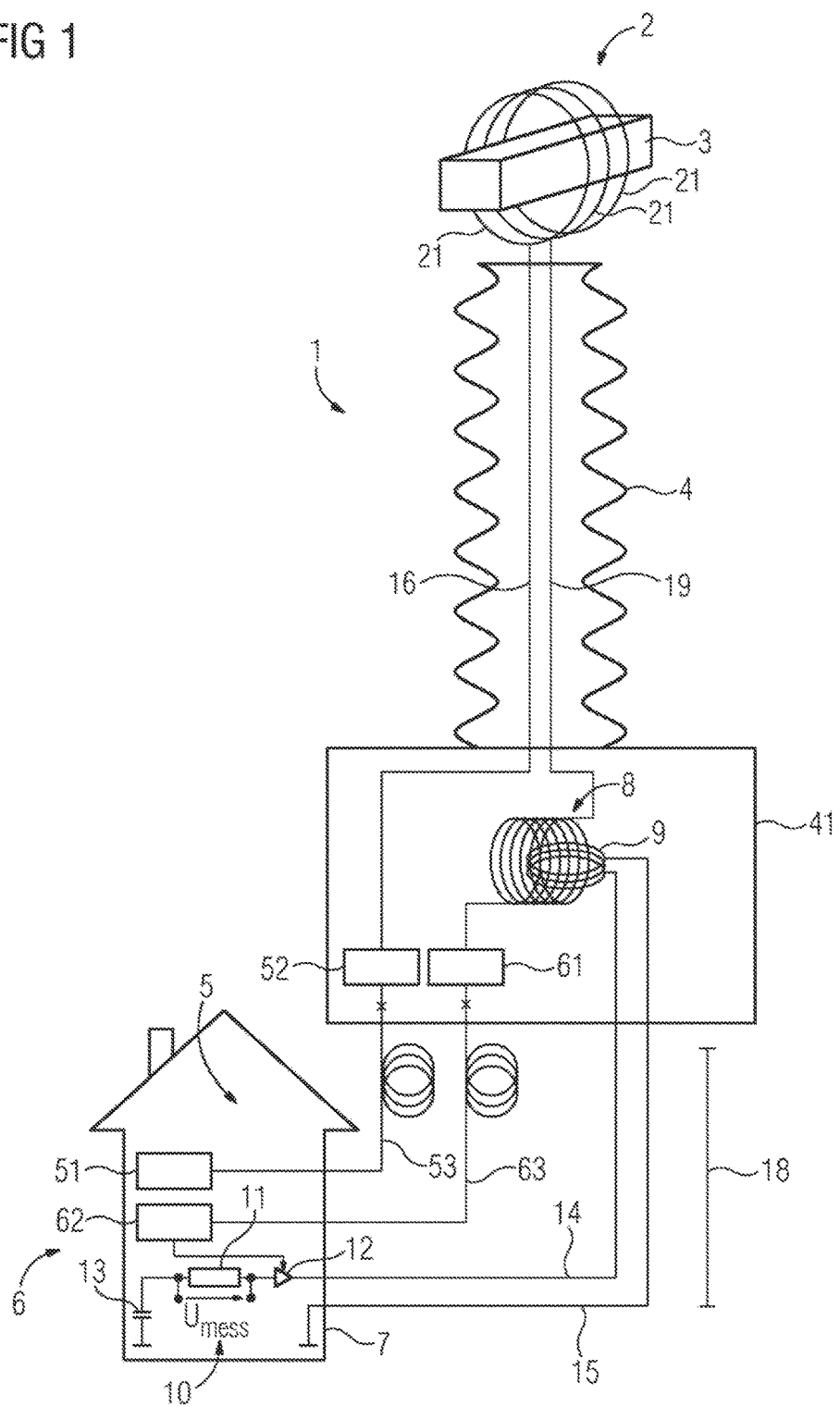
FIG. 1 shows a schematic structure of an exemplary embodiment of a measuring device according to the invention.

A sketch of a measuring device 1 is accordingly illustrated in the figure. The measuring device 1 comprises a Faraday sensor device 2 which is arranged close to a high-voltage electrical conductor 3. The Faraday sensor device 2 comprises a plurality of optical fiber windings 21 which are wound around the high-voltage electrical conductor 3. In the variant illustrated here, the electrical conductor 3 is part of a high-voltage installation (not illustrated).

The high-voltage electrical conductor 3 is thus at a high-voltage potential. An insulation element 4 is provided for a potential insulation between the high-voltage potential and the ground potential, extending between the high-voltage electrical conductor 3 and the ground, and is illustrated here as being formed as a hollow insulator. The insulation element 4 further comprises an insulator foot 41, on which the insulation element 4 is placed.

The measuring device 1 further comprises a light source 5. The light source 5 comprises a light generation element 51 and a polarization element 52. The polarization element 52 is arranged in the insulating foot 41. The light generation element 51 is arranged in a building 7. The building 7 is set up to house parts of the measuring device 1 as well as further parts of the high-voltage installation. In the figure, a line 18 is used to suggest that the distance between the building 7 and the insulation element 4 can be up to several thousand meters. The light generation element 51 and the polarization element 52 are connected together by means of an optical fiber 53.

The detector comprises a polarization analyzer 61, an intensity sensor 62 and an optical fiber 63, where the optical fiber 63 connects the polarization analyzer 61 to the intensity sensor 62. The polarization analyzer 61 is arranged, in the form illustrated, in the insulator foot 41. The intensity sensor 62 is arranged in the building 7, also at ground potential.

The measuring device 1 further comprises a compensating Faraday sensor device 8 that is integrated into an optical fiber 19 extending between the polarization analyzer 61 and the Faraday sensor device 2. In the exemplary embodiment of the invention illustrated in the figure, the compensating Faraday sensor device 8 is constructed as a fiber coil, where the fiber windings of the fiber coil are wound around a compensation electrical conductor 9. In the exemplary embodiment illustrated, the compensation electrical conductor 9 comprises a plurality of windings of an electrical conductor.

The measuring device 1 furthermore comprises a control device 10 which, in the variant illustrated here, is arranged in the building 7. The control device 10 is illustrated in a simplified manner in the figure. The control device 10 accordingly comprises a measurement resistor 11, a feedback loop 12 and a voltage source 13. The control device 10 is connected by means of electrically conductive connections 14 and 15 to the compensation electrical conductor 9, so that a suitable circuit is formed.

In the exemplary embodiment illustrated, the compensating Faraday sensor device 8, the compensation electrical conductor 9 and the control device 10 form elements of a compensation element.

The manner in which the measuring device 1 functions will be considered more closely below. A light signal is generated by means of the light generation element 51. This light signal does not yet have any defined polarization. The light signal is passed through the optical fiber 53 to the polarization element 52. The light signal is set into a well-defined polarization state by means of the polarization element 52. The polarized primary light signal is accordingly provided at the output of the polarization element 52. The primary light signal is passed to the Faraday sensor device 2 by means of a polarization-maintaining optical fiber 16. The primary light signal circulates around the high-voltage electrical conductor 3. The primary light signal has linear polarization in the exemplary embodiment of the measuring device 1 illustrated in the figure. This means that the primary light signal exhibits a well-defined polarization angle with respect to a predefined zero angle, e.g. zero degrees. As a result of the Faraday effect, this polarization angle changes in the magnetic field of the high-voltage electrical conductor 3. This means that a secondary light signal with a changed polarization is provided at the output of the Faraday sensor device. The secondary light signal passes through the optical fiber 19, and is fed into the compensating Faraday sensor device 8. By means of the current flowing through the compensation electrical conductor 9 a magnetic field can be generated here, which creates an opposite change in the polarization of the secondary light signal in the compensating Faraday sensor device.

For the purposes of explanation, it will be assumed below that in the presence of a given current ih through the high-voltage electrical conductor 3, the secondary light signal exhibits a change of polarization that corresponds to a rotation of the plane of polarization through an angle ah. The opposite polarization in the compensating Faraday sensor device 8 creates, for example, in the presence of a given value ik of the compensation current, a rotation of the angle of polarization through the additional angle ak, which can also adopt negative values. At the output of the compensating Faraday sensor device, the secondary light signal thus in total exhibits a rotation of the plane of polarization through the angle ah+ak. An intensity signal that depends on the angle ah+ak is generated in the polarization analyzer 61, and is passed to the intensity sensor 62. The polarization analyzer 61 is set up in such a way that it outputs a zero intensity signal for the angle ah+ak=0°. If the intensity signal is not equal to zero, then a positive or negative amplification of the compensation current is created through the feedback loop 12. It is possible to determine whether an over-compensation or an under-compensation is present, i.e. whether a positive or negative amplification should be applied, for example by means of a suitable additional measurement, a suitably selected evaluation, or through an overlaid high-frequency signal outside the measuring range. The value of the angle ak can in turn be affected in this way. If the compensation current ik is finally adjusted such that it causes rotation of the plane of polarization through an angle ak such that ah+ak=0, then the complete compensation of the change of polarization of the secondary light signal through opposite polarization has been reached. The voltage Umax measured at the measurement resistor 11 at this compensation current carries the information about the electrical current ih in the high-voltage electrical conductor 3.

Figure 2:
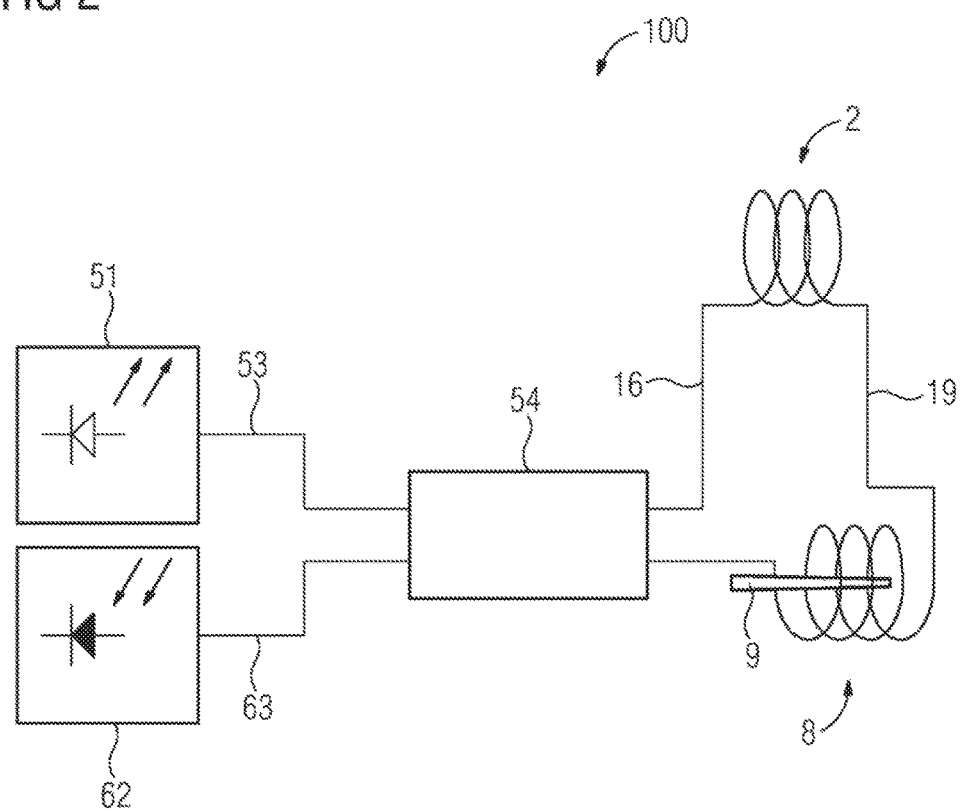
FIG. 2 shows a schematic representation of a further exemplary embodiment of the measuring device according to the invention.

A further exemplary embodiment of the measuring device 100 according to the invention is sketched in FIG. 2. Identical parts have been given the same reference signs in the FIGS. 1 and 2. The general manner in which the measuring device 100 functions corresponds to that of measuring device 1. For reasons of clarity, only the differences between the exemplary embodiments of the FIGS. 1 and 2 will be considered in more detail below.

The measuring device 100 of FIG. 2 differs from the measuring device 1 of FIG. 1 in that the polarization element 52 and the polarization analyzer 61 in FIG. 1 are replaced in FIG. 2 by a phase modulator 54. The phase modulator 54 has two inputs and two outputs. The phase inputs and outputs of the phase modulator 54 are arranged such that the primary light signal and the secondary light signal pass through the phase modulator 54.

Figure 3:
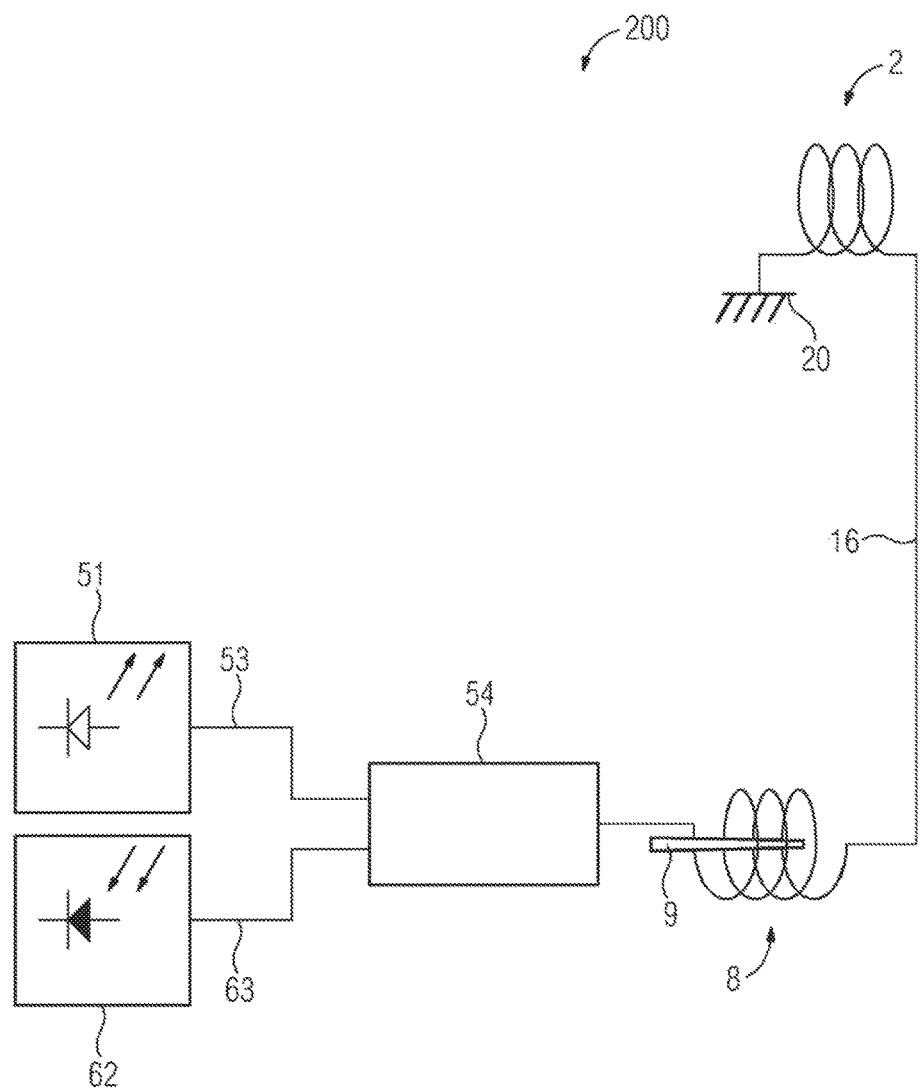
FIG. 3 shows a schematic representation of a further alternative exemplary embodiment of the device according to the invention.

An alternative exemplary embodiment of a measuring device 200 according to the invention is sketched in FIG. 3. Identical or similar parts of the measuring devices 100 and 200, respectively, have been given the same reference signs in the FIGS. 1 and 3. Only the differences between the measuring devices 100 and 200 of FIGS. 2 and 3 are considered in more detail below.

In the exemplary embodiment of FIG. 3, the measuring device 200 also has a phase modulator 54. The phase modulator 54 of measuring device 200 has two inputs and one output. The polarization-maintaining optical fibers 16 and 19 of the measuring device 100 of FIG. 2 thus coincide in the measuring device 200 of FIG. 3. Both the primary light signal and the secondary light signal thus pass along the polarization-maintaining optical fiber 16. The primary light signal and the secondary light signal are overlaid in the optical fiber 16. The measuring device 200 further comprises a mirror 20 that is arranged at the Faraday sensor device. The primary light signal reflects at the mirror 20, and thus reverses its direction of propagation.

LIST OF REFERENCE SIGNS

1, 100, 200 Measuring device
2 Faraday sensor device
21 Fiber winding
3 High-voltage electrical conductor
4 Insulation element
41 Insulator foot
5 Light source
51 Light generation element
52 Polarization element
53, 63 Optical fiber
54 Phase modulator
6 Detector
61 Polarization analyzer
62 Intensity sensor
7 Building
8 Compensating Faraday sensor device
9 Compensation electrical conductor
10 Control device
11 Measurement resistor
12 Feedback loop
13 Voltage source
14, 15 Optical fiber
16, 19 Polarization-maintaining optical fiber
20 Mirror

The invention claimed is:

1. A measuring device for measuring an electrical current, the measuring device comprising:
   a Faraday sensor;
   a light source for generating a polarized primary light signal for feeding into said Faraday sensor device, said light source including an optical fiber, a light generation element and, separate from said light generation element, a polarization element, said light generation element and said polarization element are connected together by means of said optical fiber;
   a polarization-maintaining optical fiber connecting said polarization element and said Faraday sensor together to carry said polarized primary light signal;
   a detector for detecting a secondary light signal provided by said Faraday sensor device and altered in polarization in relation to the polarized primary light signal; and
   a compensation element, by which a change in the polarization of the secondary light signal can be compensated for by an opposite change in the polarization, and a measurement signal that depends on the opposite change in the polarization can be derived for the electrical current.

2. The measuring device according to claim 1, wherein said compensation element has a compensating Faraday sensor and a compensation electrical conductor disposed close to said compensating Faraday sensor, wherein the secondary light signal passes through said compensating Faraday sensor, and a compensation current in said compensation electrical conductor can be adjusted in such a way that a change in the polarization of the secondary light signal can be compensated, wherein the measurement signal can be derived from the compensation current.

3. The measuring device according to claim 2, wherein said compensation element has a control device that is configured for a zero-regulation of the change of polarization of the secondary light signal or of a controlled variable derived from it, making use of the compensation current as a manipulated variable.

4. The measuring device according to claim 2, wherein said Faraday sensor and said compensating Faraday sensor have an equivalent construction.

5. The measuring device according to claim 1, wherein said detector is configured to detect a light intensity depending on a polarization state of the secondary light signal.

6. The measuring device according to claim 5, wherein said detector has a polarization analyzer.

7. The measuring device according to claim 6, wherein said polarization analyzer is adjusted such that the secondary light signal without a change of polarization results in a zero-signal at an output of said detector.

8. The measuring device according to claim 1, wherein said Faraday sensor has an optical fiber coil or a glass ring for guiding the primary light signal.

9. The measuring device according to claim 1, wherein said Faraday sensor is disposed close to a high-voltage electrical conductor, so that the measurement signal for the electrical current in the high-voltage electrical conductor can be derived.

10. The measuring device according to claim 9, wherein said light source and said detector are disposed at ground potential.

11. The measuring device according to claim 10, wherein said detector contains a further optical fiber, a polarization analyzer and, separate from said polarization analyzer, an intensity sensor, said polarization analyzer and said intensity sensor are connected together by said further optical fiber; and
further comprising another polarization-maintaining optical fiber to carry the secondary light signal, which connects said Faraday sensor and said polarization analyzer together.

12. The measuring device according to claim 1, wherein at least a portion of said detector is disposed adjacent to a compensating Faraday sensor.

13. A method for measuring an electrical current, which comprises the steps of:
   providing a measuring device according to clam 1;
   feeding in a primary light signal generated by the light source, into the Faraday sensor and the Faraday sensor providing a secondary light signal with a polarization that has been changed in relation to the primary light signal;
   compensating for, via a compensation element, a change in the polarization of the secondary light signal by an opposite change in the polarization; and
   deriving a measurement signal that depends on the opposite change in the polarization for the electrical current.

14. The method according to claim 13, which further comprises performing the compensating step for compensation of the change of polarization of the secondary light signal by means of a zero-regulation of the change of polarization or by means of a zero-regulation of a controlled variable derived from that.

15. The method according to claim 14, wherein the secondary light signal passes through a compensating Faraday sensor which is disposed physically close to a compensation electric conductor, and the zero-regulation is performed with a compensation current through the compensation electric conductor as a manipulated variable.

\* \* \* \* \*